United States Patent [19]

Kakimoto et al.

[11] Patent Number: 5,166,087

[45] Date of Patent: Nov. 24, 1992

[54] METHOD OF FABRICATING SEMICONDUCTOR ELEMENT HAVING LIGHTLY DOPED DRAIN (LDD) WITHOUT USING SIDEWALLS

[75] Inventors: Seizo Kakimoto; Katsuji Iguchi; Sung T. Ahn, all of Nara, Japan

[73] Assignee: Sharp Kabushiki Kaisha, Japan

[21] Appl. No.: 820,076

[22] Filed: Jan. 13, 1992

[30] Foreign Application Priority Data

Jan. 16, 1991 [JP] Japan .................................. 3-23658
Jul. 22, 1991 [JP] Japan .................................. 3-180905

[51] Int. Cl.⁵ .......................................... H01L 21/265
[52] U.S. Cl. .................................... 437/44; 437/27; 437/28; 437/29; 437/56; 437/34
[58] Field of Search .............. 437/44, 27, 28, 29, 437/56, 34, 37

[56] References Cited

U.S. PATENT DOCUMENTS

| | | | |
|---|---|---|---|
| 4,843,023 | 6/1989 | Chiu et al. | 437/29 |
| 5,015,595 | 5/1991 | Wollesen | 437/44 |
| 5,036,019 | 7/1991 | Yamane et al. | 437/44 |
| 5,073,514 | 12/1991 | Ito et al. | 437/29 |

*Primary Examiner*—Brian E. Hearn
*Assistant Examiner*—Trung Dang
*Attorney, Agent, or Firm*—Nixon & Vanderhye

[57] ABSTRACT

A method of fabricating an insulating gate type field-effect transistor in which a region having a low carrier density for mitigating electric field is provided so as to abut on a source/drain region having a high carrier density, the method comprising the steps of: forming a gate insulating film and a gate electrode on a semiconductor substrate; depositing an insulating thin film on the gate electrode and the gate insulating film to a vertical thickness; and performing from above the insulating thin film, ion implantation at an implantation energy inducing a projected range of ions approximately equal to the vertical thickness of the insulating thin film so as to form the source/drain region; wherein a horizontal thickness of the insulating thin film on opposite sides of the gate electrode is larger than a sum of a lateral diffusion distance of the source/drain region at the time of the ion implantation and a lateral diffusion distance of the source/drain region after the ion implantation.

5 Claims, 12 Drawing Sheets

METHOD OF FABRICATING SEMICONDUCTOR ELEMENT HAVING LIGHTLY DOPED DRAIN (LDD) WITHOUT USING SIDEWALLS

BACKGROUND OF THE INVENTION

The present invention generally relates to a method of fabricating a semiconductor element and more particularly, to a method of fabricating an insulating gate type field-effect transistor.

In the insulating gate type field-effect transistor utilized in semiconductor integrated circuits in current use, hot carrier is produced by sharp electric field caused in the direction of the channel due to further miniaturization of elements, thereby resulting in deterioration of characteristics of the elements.

In order to mitigate concentration of electric field in the vicinity of a boundary between a channel region and a drain region subjected to a high voltage for the purpose of preventing deterioration of characteristics of the elements, a lightly doped drain (LDD) structure shown in FIG. 3 in which a region 10 having a low carrier density is provided between a source/drain region 13 having a high carrier density and a channel region disposed below a gate electrode 9 or a gate overlap structure shown in FIG. 4 in which a region 17 having a low carrier density for mitigating electric field as in the LDD structure is provided below a gate electrode 16 by oblique ion implantation so as to overlap the gate electrode 16 is employed.

Conventionally, the LDD structure is fabricated as shown in FIGS. 5(a) to 5(c). Initially, the region 10 having a low carrier density is formed by performing ion implantation at low density as shown in FIG. 5(a). Then, as shown in FIG. 5(b), an insulating film 11 is deposited on the gate electrode 9. Subsequently, the insulating film 11 is etched so as to form a pair of side walls 12 on the gate electrode 9. When ion implantation is performed at high density by using the side walls 12 as a mask, the source/drain region 13 having a high carrier density is formed. As a result, the region 10 having a low carrier density is formed between the channel region disposed below the gate electrode 9 and the source/drain region 13 having a high carrier density as shown in FIG. 5(c).

Meanwhile, the gate overlap structure employing oblique ion implantation is fabricated as shown in FIGS. 6(a) to 6(c). Initially, the region 17 having a low carrier density is formed by oblique ion implantation as shown in FIG. 6(a). Thereafter, an insulating film 18 is deposited on the gate electrode 16 as shown in FIG. 6(b). Subsequently, the insulating film 18 is etched so as to form a pair of side walls 19 on the gate electrode 16. When ion implantation is performed at high density by using the side walls 19 as a mask, the source/drain region 20 having a high carrier density is formed and thus, the region 17 having a low carrier density is formed below the gate electrode 16 so as to overlap the gate electrode 16. In the gate overlap structure, a method is proposed in which ion implantation at high density is performed without forming the side walls 19. However, in this method, leakage current increases due to damage caused by ion implantation at high density. In this respect, it may be preferable that the side walls 19 be formed.

In the above mentioned methods for producing the LDD structure and the gate overlap LDD structure, the steps of depositing the insulating film, etching the insulating film and performing ion implantation at low density are added in comparison with an insulating gate type field-effect transistor of ordinary structure. Thus, especially, such problems as damages to active layers by dry etching at the time of etching of the insulating film and defects caused by production of stress due to improper shape of the side walls arise.

Furthermore, conventionally, in the case where a complementary metal-oxide-semiconductor (CMOS) device having the LDD structure is fabricated, polysilicon gates are, respectively, formed initially on an n-channel metal-oxide-semiconductor (NMOS) region and a p-channel metal-oxide-semiconductor (PMOS) region which are provided on a substrate. Then, by implanting n type impurities and p type impurities, $n^-$ type regions are formed on opposite sides of the polysilicon gate in the NMOS region, while $p^-$ type regions are formed on opposite sides of the polysilicon gate in the PMOS region. Each time the above ion implantation is performed, photolithography is performed such that n type impurities and p type impurities are not implanted into the PMOS region and the NMOS region, respectively. Then, a silicon dioxide ($SiO_2$) film is deposited on a wafer and is subjected to anisotropic etching such that a pair of side walls (spacers) made of silicon dioxide are formed on opposite sides of each of the polysilicon gates. Subsequently, by performing ion implantation, a source-drain region ($n^+$type region) is formed at a location spaced a distance approximately equal to thickness of the side walls from the polysilicon gate in the NMOS region, while a source-drain region ($p^+$type region) is formed at a location spaced a distance approximately equal to thickness of the side walls from the polysilicon gate in the PMOS region. Each time the above ion plantation for the $n^+$type and $p^+$type regions is performed, photolithography is performed such that n type impurities and p type impurities are not implanted into the PMOS region and the NMOS region, respectively in the same manner as in formation of the $n^-$type and $p^-$type regions. Thereafter, in order to repair damages caused by ion implantation, the $n^-$type and $p^-$type regions and the $n^+$type and $p^+$type regions are annealed concurrently. This annealing is performed relatively powerfully, i.e. at a relatively high temperature on the basis of the $n^+$type and $p^+$type regions sustaining great damage.

However, the steps of the above mentioned known fabrication method are excessively complicated in that the photolithography step is carried out each time ion implantation is performed and further, the side walls are formed by etching. Furthermore, since annealing is performed relatively powerfully on the basis of the $n^+$type and $p^+$type regions, impurities in the $n^-$type and $p^-$type regions are diffused excessively and thus, transistor characteristics are deteriorated by short channel effect of transistors.

SUMMARY OF THE INVENTION

Accordingly, an essential object of the present invention is to provide a method of fabricating an insulating gate type field-effect transistor having a low carrier density region for mitigating electric field, which is simplified in steps and is free from problems due to formation of side walls.

Another important object of the present invention is to provide a method of fabricating a semiconductor device, in which a CMOS device having an LDD structure can be fabricated in simple steps and excessive diffusion of n⁻type and p⁻type regions constituting the LDD structure can be prevented.

In order to accomplish the first object of the present invention, a method of fabricating an insulating gate type field-effect transistor in which a region having a low carrier density for mitigating electric field is provided so as to abut on a source/drain region having a high carrier density, according to one embodiment of the present invention comprises the steps of: forming a gate insulating film and a gate electrode on a semiconductor substrate; depositing an insulating thin film on the gate electrode and the gate insulating film to a vertical thickness; and performing from above the insulating thin film, ion implantation at an implantation energy inducing a projected range of ions approximately equal to the vertical thickness of the insulating thin film so as to form the source/drain region; wherein a horizontal thickness of the insulating thin film on opposite sides of the gate electrode is larger than a sum of a lateral diffusion distance of the source/drain region at the time of the ion implantation and a lateral diffusion distance of the source/drain region after the ion implantation.

The insulating thin film may be formed either after the low carrier density region has been formed or after the high carrier density region has been formed.

In the latter case, since the low carrier density region is formed after the insulating thin film has been removed, it is desirable that a stacked structure including an etching stopper is employed.

It is quite preferable that the implantation energy is so set as to maximize density of impurities on the surface of the semiconductor substrate. To this end, projected range of ions should be equal to a sum of thickness of the gate insulating film and thickness of the insulating thin film. Meanwhile, in the case where the etching stopper is formed, thickness of the insulating thin film should include thickness of the etching stopper.

Since thickness of the gate insulating film is quite small as compared with the vertical thickness of the insulating thin film, only the vertical thickness of the insulating thin film may be employed as a parameter.

Meanwhile, the projected range of ions is so set as to be approximately equal to the vertical thickness of the insulating thin film in view of a permissible error for practical use. More specifically, even if error of the implantation energy giving the maximum density of impurities on the surface of the semiconductor substrate reaches approximately standard deviation of projected range of ions, about 60% of the maximum density of impurities on the surface of the semiconductor substrate can be obtained, which poses no problem for practical use.

Furthermore, in this method, the vertical thickness of the insulating thin film is equal to the horizontal thickness of the insulating thin film. If the vertical thickness of the insulating thin film is different from the horizontal thickness of the insulating thin film, it becomes difficult to simultaneously satisfy both relation between the horizontal thickness of the insulating thin film and the diffusion distances and relation between the vertical thickness of the insulating thin film and the implantation energy. Therefore, it is desirable that the vertical thickness of the insulating thin film is substantially equal to the horizontal thickness of the insulating thin film by employing, for example, reduced pressure CVD.

In accordance with the present invention, after ion implantation for forming the low carrier density region has been performed, the insulating thin film is deposited and then, further ion implantation for forming the high carrier density region is performed without etching the insulating film in contrast with prior art methods. By properly setting thickness of the gate electrode and thickness of the insulating film as well as implantation energy and dose of the further ion implantation, it becomes possible to fabricate the field-effect transistor in which the low carrier density region for mitigating electric field is formed without forming the side walls of the gate electrode by etching the insulating film. Meanwhile, the present invention can be applied not only to NMOS transistors but to PMOS transistors.

In accordance with the present invention, steps of the method of fabricating the field-effect transistor having the low carrier density region for mitigating electric field are simplified as compared with those of prior art methods.

Moreover, in accordance with the present invention, problems resulting from formation of the side walls of the gate electrode as in the prior art methods are eliminated, thereby resulting in excellent reproducibility and uniformity of fabrication process of the semiconductor element.

Meanwhile, in order to accomplish the second object of the present invention, a method of fabricating a semiconductor device, according to another embodiment of the present invention comprises the steps of: forming on a substrate having a gate electrode, a stack of a lower silicon dioxide film, an etching stopper film made of a material capable of being etched selectively for a silicon dioxide film and an upper silicon dioxide film so as to set the stack of the lower silicon dioxide film, the etching stopper film and the upper silicon dioxide film to a predetermined thickness such that an upper face and opposite side faces of the gate electrode and a portion of a surface of the substrate disposed on opposite sides of the gate electrode are covered by the stack; performing ion implantation substantially perpendicularly to the surface of the substrate through the stack such that a pair of n+type regions or a pair of p+type regions acting as source and drain regions are, respectively, formed at locations which are disposed on opposite sides of the gate electrode and are spaced a distance approximately equal to the thickness of the stack from the gate electrode; etching the upper silicon dioxide film up to the etching stopper film; and performing further ion implantation substantially perpendicularly to or obliquely relative to the surface of the substrate so as to form an n⁻type region or a p⁻type region at an end portion of the n+type regions or the p+type regions adjacent to the gate electrode.

Furthermore, it is desirable that the method further comprises the step of performing ion implantation obliquely relative to the surface of the substrate so as to form a halo region having a conductive type opposite to that of the n⁻type region or the p⁻type region such that the halo region encloses the n⁻type region or the p⁻type region.

In the present invention, a CMOS device, for example, is fabricated as follows. Initially, the stack of the lower silicon dioxide film, the etching stopper film made of the material capable of being etched selectively for a silicon dioxide film and the upper silicon dioxide film is formed on the substrate having the gate electrode so as to have the predetermined thickness such that the upper face and opposite side faces of the gate electrode and the portion of the surface of the substrate disposed on the opposite sides of the gate electrode are covered by the stack. Then, photolithography is performed so as to cover, for example, the PMOS region with a photoresist. When ion implantation is performed substantially perpendicularly to the surface of the substrate in this state, a pair of the n+type regions acting as the source and drain regions are, respectively, formed at locations in the NMOS region, which are disposed on the opposite sides of the gate electrode and are spaced the distance approximately equal to the thickness of the stack from the gate electrode.

Subsequently, etching is performed by using the above mentioned photoresist as a mask so as to remove a portion of the upper silicon dioxide film disposed in the NMOS region. At this time, the etching stopper film acts as a so-called etching stopper so as to protect the lower silicon dioxide film and other constituent portions disposed below the lower silicon dioxide film.

Then, photolithography, for example, is performed so as to cover the NMOS region with the photoresist. Thereafter, ion implantation is performed substantially perpendicularly to the surface of the substrate through the stack such that a pair of the p+type regions acting as the source and drain regions are, respectively, formed at the locations in the PMOS region, which are disposed on the opposite sides of the gate and are spaced the distance approximately equal to the thickness of the stack from the gate electrode. At this stage, heat treatment is performed so as to recover damages to the n+type regions and the p+type regions due to ion implantation. At this time, since the n−type regions and the p−type regions which constitute the LDD structure are not formed yet, no problem arises even if this heat treatment is performed relatively powerfully.

Subsequently, the photoresist is removed. Then, by using the upper silicon dioxide film remaining in the PMOS region as a mask, ion implantation is further performed substantially perpendicularly to or obliquely relative to the surface of the substrate so as to form the n−type region at the end portion of the n+type regions adjacent to the gate electrode. At this time, since the upper silicon dioxide is used as the mask as described above, photolithography is eliminated.

Meanwhile, if necessary, after the upper silicon dioxide film remaining in the PMOS region has been removed, the NMOS region is covered by the photoresist. When ion implantation is performed substantially perpendicularly to or obliquely relative to the surface of the substrate in this state, the p−type region is formed at the end portion of the p+type regions adjacent to the gate electrode. At this stage, heat treatment for the n−type regions and the p−type regions is performed. At this time, since the heat treatment for the n+type regions and the p+type regions has already been completed, the above heat treatment can be performed at a relatively low temperature. Therefore, excessive diffusion of impurities in the n−type region and the p−type region can be prevented, thus resulting in improvement of short channel characteristics of transistors.

As described above, when the present invention is applied to the NMOS region and the PMOS region in combination with photolithography, the CMOS device having the LDD structure can be fabricated easily. Furthermore, since the heat treatment for the n−type region and the p−type region can be performed after the heat treatment for the n+type regions and the p+type regions has been been completed, excessive diffusion of impurities in the n−type region and the p−type region can be prevented.

Meanwhile, in the case where by performing ion implantation obliquely relative to the surface of the substrate, the halo region having the conductive type opposite to that of the n−type region or the p−type region is formed so as to enclose the n−type region or the p−type region, expansion of the depletion region will be suppressed when a bias is applied to the drain terminal. Accordingly, short channel characteristics of transistors are further improved and thus, the CMOS device can also be miniaturized.

BRIEF DESCRIPTION OF THE DRAWINGS

These objects and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1A:
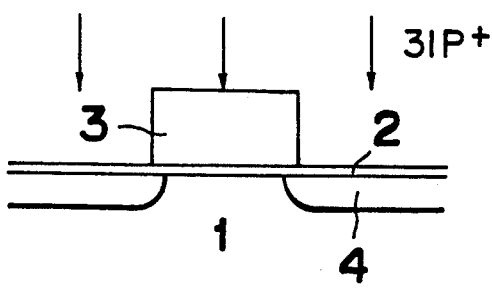
FIGS. 1(a) and 1(b) are views showing steps of a method of fabricating a semiconductor element, according to a first embodiment of the present invention.
Figure 1B:
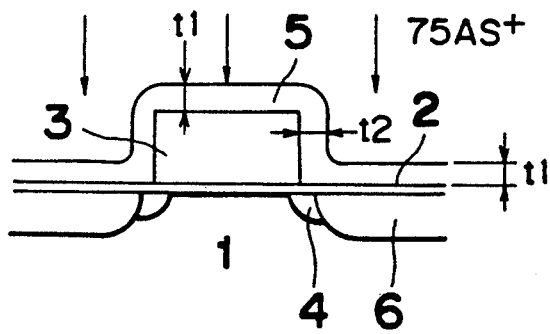

Referring now to the drawings, there is shown in FIGS. 1(a) and 1(b), steps of a method of fabricating an insulating gate type field-effect transistor having an LDD structure, according to a first embodiment of the present invention. As shown in FIG. 1(a), a gate insulating film 2 and an n+polysilicon gate electrode 3 are initially formed on a silicon substrate 1 in a known manner. Then, when ion implantation of $^{31}p^+$ is performed at implantation energy of 40 to 50 keV and at a dose of $1 \times 10^{13}$ to $5 \times 10^{13}/cm^2$ by using the gate electrode 3 as a mask, an n−region 4 is formed in the vicinity of the gate electrode 3. It may also be so arranged that before ion implantation, a thin insulating film is formed by thermal oxidation or CVD method so as to act as an implantation protective film or an offset film for the gate electrode 3 and the n⁻region 4. Ion implantation may be performed either by fixing the substrate 1 in position or by an intermittent implantation method in which dose is equally divided into a portion by a certain numeral such that the the substrate 1 is rotated, for each ion implantation of the portion of the dose, through an angle obtained by dividing 360° by the numeral. As long as projected range of ions is sufficiently larger than thickness of the gate insulating film 2, the implantation energy is not limited to the above value. Meanwhile, if the dose is far smaller than a dose for forming a region having a high carrier density, the dose is not restricted to the above value. The ion $^{31}P^+$ may be replaced by $^{75}As^+$ or $^{122}Sb^+$.

Then, as shown in FIG. 1(b), an insulating film 5 is deposited on the gate insulating film 2 and the gate electrode 3 to a vertical thickness t1 of 500 to 1,000 Å by reduced pressure CVD. Subsequently, when ion implantation of $^{75}As^+$ is performed at an implantation energy of 80 to 180 keV and at a does of $3 \times 10^{15}$ to $5 \times 10^{15}/cm^2$ by using the gate electrode 3 and the insulating film 5 as a mask, an n +source-drain region 6 is formed. The insulating film 5 may be made of $SiO_2$, SiN or the like. The insulating film 5 is provided for offsetting the n+region 6 from the edge of the gate electrode 3 at the time of implantation of n+ions so as to separate the n+region 6 from the n⁻region 4. A horizontal thickness t2 of the insulating film 5 on opposite sides of the gate electrode 3 corresponds to an offset amount. The horizontal thickness t2 is so set as to be larger than a sum of a lateral diffusion distance D of the n+region 6 in a step subsequent to heat treatment and a lateral diffusion distance Rt of the n+region 6 at the time of ion implantation such that the n+region 6 does not overlap the gate electrode 3.

It is known that if the n+region 6 overlaps the gate electrode 3, band-to-band tunneling current is generated in a depletion layer on the surface of the n+region when the n+region 6 is biased positively relative to the gate electrode 3. Since this tunnel current not only becomes leakage current of the transistor but shortens life time of the transistor undesirably, the horizontal thickness t2 of the insulating film 5 should be set as described above. Since junction depth is also required to be reduced in response to miniaturization of elements, heat treatment conditions after ion implantation at high density change to shorter period and lower temperature, thereby resulting in decrease of the lateral diffusion distance D. Therefore, the horizontal thickness t2 of the insulating film 5 is reduced so as to assume the above value approximately. The implantation energy is set such that projected range of n+ions approximately assumes a value of the above mentioned vertical thickness t1 of the insulating film 5, whereby n+density on the Si surface becomes sufficiently high without etching the insulating film 5 in contrast with the prior art methods.

If the vertical thickness t1 of the insulating film 5 is different from the horizontal thickness t2 of the insulating film 5, it becomes difficult to simultaneously satisfy both relation between the horizontal thickness t2 of the insulating film 5 and the lateral diffusion distances D and Rt of the n+region 6 and relation between the vertical thickness t1 of the insulating film 5 and the implantation energy. Therefore, it is desirable that the vertical thickness t1 of the insulating film 5 is substantially equal to the horizontal thickness t2 of the insulating film 5 by employing, for example, reduced pressure CVD.

In response to reduction of the horizontal thickness t2 of the insulating film 5, ion implantation can be performed without the need for using an especially high implantation energy as described above. In the vicinity of the gate electrode 3, the insulating film 5 covering opposite sides of the gate electrode 3 has a larger effective film thickness against ion implantation than thickness of the gate electrode 3. Therefore, if film thickness of the gate electrode 3 is set sufficiently higher than projected range of implanted ions, n+ions are hardly implanted into the silicon substrate 1, so that the insulating film 5 is capable of serving to offset the n+layer As a result, in contrast with the known methods, the LDD structure in which the n⁻region 4 is provided between the channel region disposed below the gate electrode 3 and the n+source-drain region 6 without the need for forming the side walls by etching the insulating film 5.

As will be seen from Table 1 below, the transistor fabricated by the method of the present invention has transistor characteristics identical with those of a transistor whose LDD structure only has been fabricated by the known methods.

TABLE 1

|  | (Present invention) | (Prior art) |
|---|---|---|
| [Gate length] | 0.6 μm | 0.6 μm |
| [Threshold voltage] | 0.72 V | 0.74 V |
| [Drive current] | 3.6 mA | 3.6 mA |
| [I submax/Id] | 3.8E-3 | 3.0E-3 |

W = 10.0 μm, Vd = 3.3 V

Figure 2A:
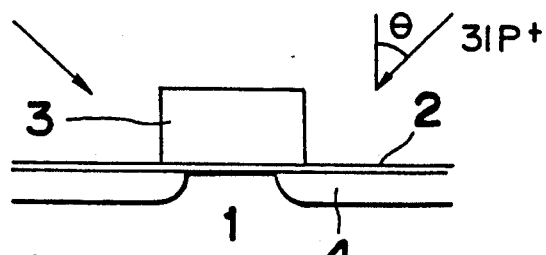
FIG. 2(a) and 2(b) are views showing steps of a method of fabricating a semiconductor element, according to a second embodiment of the present invention.
Figure 2B:
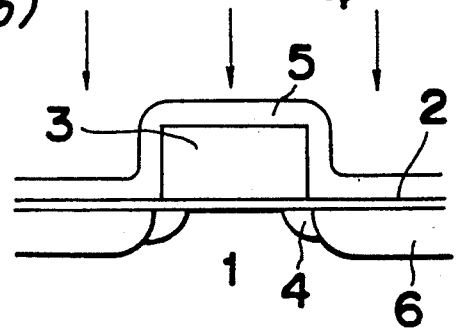
Figure 3:
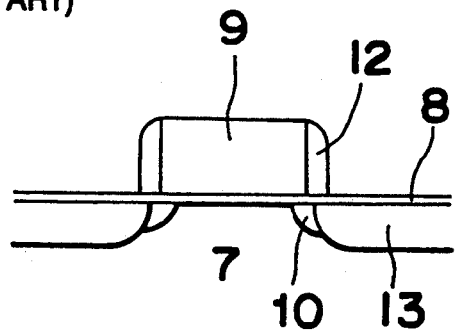
FIG. 3 is a schematic sectional view of a prior art insulating gate type field-effect transistor having an LDD structure (already referred to)
Figure 4:
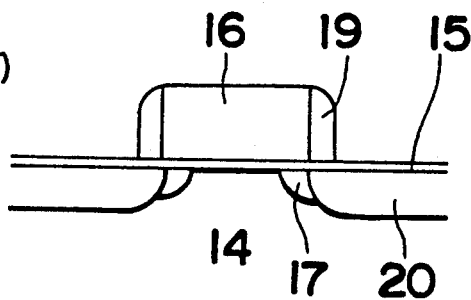
FIG. 4 is a schematic sectional view of a prior art insulating gate type field-effect transistor having a gate overlap structure based on oblique ion implantation (already referred to)
Figure 5A:
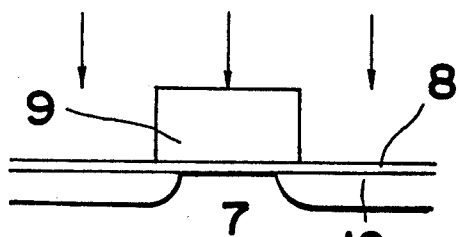
FIGS. 5(a) to 5(c) are views showing steps of a prior art method of fabricating the LDD structure of FIG. 3; (already referred to)
Figure 5B:
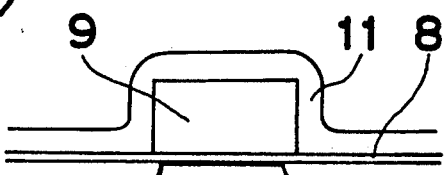
Figure 5C:
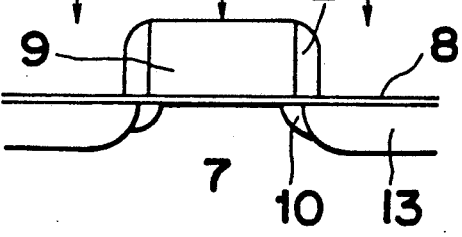
Figure 6A:
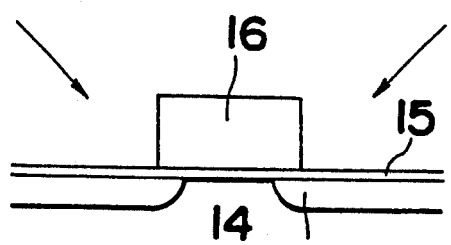
FIGS. 6(a) to 6(c) are views showing steps of a prior art method of fabricating the gate overlap structure of FIG. 4.
Figure 6B:
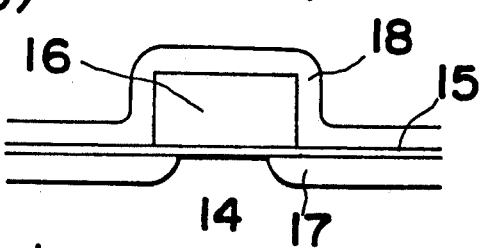
Figure 6C:
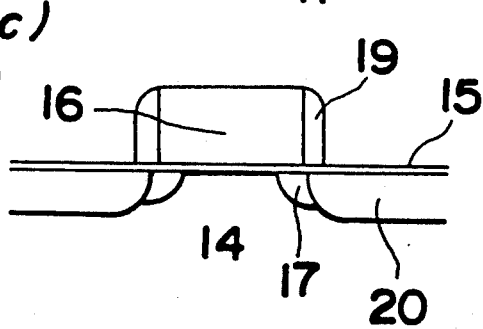

FIGS. 2(a) and 2(b) show steps of a fabricating an insulating gate type field-effect transistor having a gate overlap LDD structure based on oblique ion implantation, according to a second embodiment of the present invention. As shown in FIG. 2(a), the gate insulating film 2 and the n+polysilicon gate electrode 3 are initially formed on the silicon substrate 1 in a known manner. Then, when $^{31}P^+$ is implanted obliquely at an implantation energy of 40 to 60 keV and at a dose of to $1 \times 10^{13}$ to $10 \times 10^{13} cm^2$ by using the gate electrode 3 as a mask, an n⁻region 4 is formed below the gate electrode 3 so as to overlap the gate electrode 3. In the same manner as in the first embodiment, it may also be so arranged that before ion implantation, a thin insulating film 5 is formed by thermal oxidation or CVD method so as to act as an implantation protective film or an offset film for the gate electrode 3 and the n⁻region 4.

The n⁻region 4 is required to be formed uniformly on source and drain regions. Thus, at the time of ion implantation, it is not desirable that the substrate 1 is fixed in position because ion implantation is required to be performed at least twice from the source and drain regions. Therefore, ion implantation may be performed by rotating the substrate 1 or an intermittent implantation method may be employed in which dose is equally divided into a portion by a certain numeral such that the the substrate 1 is rotated, for each ion implantation of the portion of the dose, through an angle obtained by dividing 360° by the numeral.

Since the n⁻region 4 is formed below the gate electrode 3 so as to overlap the gate electrode 3, an implantation angle θ shown in FIG. 2(a) should be so large as 30° to 60°. As long as projected range of ions is sufficiently larger than a product of ($1/\cos\theta$) and thickness of the gate insulating film 2, the implantation energy is not limited to the above value. Furthermore, if a product of ($1/\cos\theta$) and the dose is far smaller than a dose for forming a region having a high carrier density, the does is not restricted to the above value. $^{31}P^+$ may be replaced by $^{75}As^+$ or $^{122}Sb^+$.

Subsequently, as shown in FIG. 2(b), the insulating film 5 is deposited to a thickness of 500 to 1,000 Å. Then, when $^{75}As^+$ is implanted at an implantation energy of 80 to 180 keV and at a dose of $3 \times 10^{15}$ to $5 \times 10^{15}/cm^2$ by using the gate electrode 3 and the insulating film 5 as a mask, an n+source/drain region 6 is formed. The insulating film 5 may be made of $SiO_2$, SiN or the like. Thickness of the insulating film 5 may be determined in the same manner as in the first embodiment. As a result, the gate overlap structure in which the n−region 4 is provided below the gate electrode 3 so as to overlap the gate electrode 3 is obtained by oblique ion implantation without the need for forming side walls on the gate electrode 3 by etching the insulating film 5 in contrast with the prior art methods.

As is clear from the foregoing description, in the fabrication methods according to the first and second embodiments of the present invention, the insulating gate type field-effect transistor having the low carrier density region for mitigating electric field can be fabricated without the need for forming the side walls on the gate electrode by etching the insulating film in contrast with the prior art methods.

Therefore, in accordance with the first and second embodiments of the present invention, production process of an integrated circuit employing the transistor of the above mentioned structure is simplified, thereby resulting in reduction of production cost of the integrated circuit.

Furthermore, in accordance with the first and second embodiments of the present invention, since problems resulting from formation of the side walls of the gate electrode are eliminated, fabrication process of the integrated circuit not only has excellent reproducibility and uniformity but is stabilized.

Figure 7A:
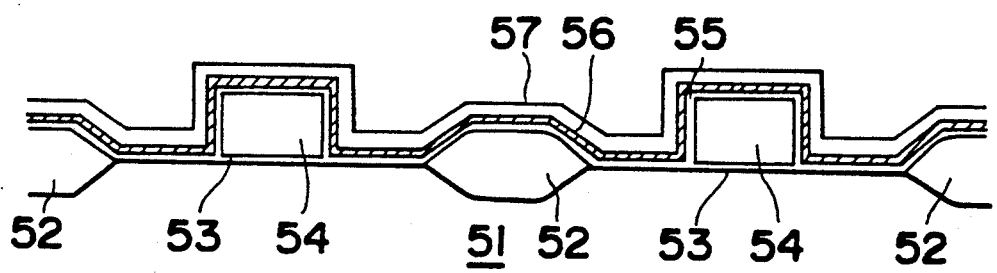
FIGS. 7(a) to 7(g) are views showing steps of a method of fabricating a CMOS device, according to a third embodiment of the present invention.

FIGS. 7(a) to 7(g) show steps of a method of fabricating a CMOS device, according to a third embodiment of the present invention. The CMOS device comprises an NMOS region having a gate-drain overlapped LDD (GOLD) structure and a PMOS region having no LDD structure. In FIGS. 7(a) to 7(g), the left and right half portions illustrate the NMOS region and the PMOS region, respectively. As shown in FIG. 7(a), a field oxidation film 52, a gate oxidation film 53 and a polysilicon gate electrode 54 are formed on a silicon substrate 51 in a known manner. Then, a lower silicon dioxide film 55, a polysilicon film (etching stopper film) 56 and an upper silicon dioxide film 57 are sequentially deposited such that a stack of the films 55 to 57 has a predetermined thickness.

Figure 7B:
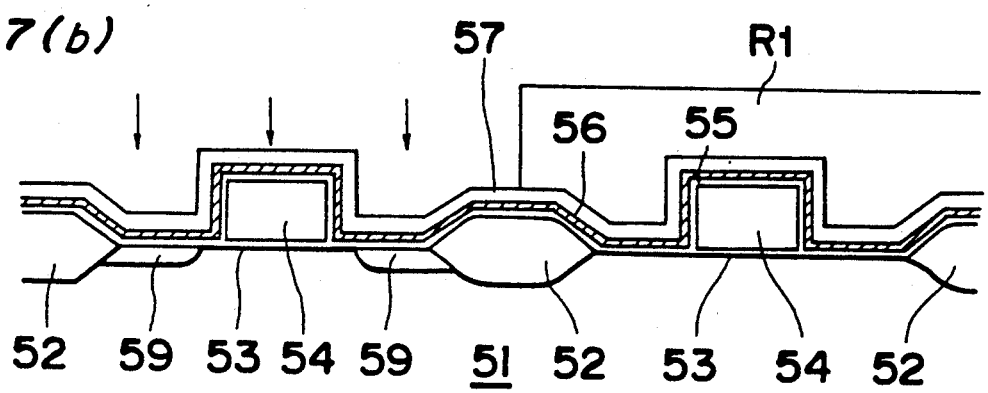

Subsequently, as shown in FIG. 7(b), photolithography is performed so as to cover the PMOS region with photoresist R1. When n type impurities are implanted substantially perpendicularly to the surface of the substrate 51 through the lower silicon dioxide film 55, the polysilicon film 56 and the upper silicon dioxide film 57 in this state, n+type regions 59 acting as source and drain regions, respectively are formed at locations which are disposed on opposite sides of the gate electrode 54 in the NMOS region and are spaced a distance approximately equal to the thickness of the stack of the films 55 to 57 from the gate electrode 54.

Figure 7C:
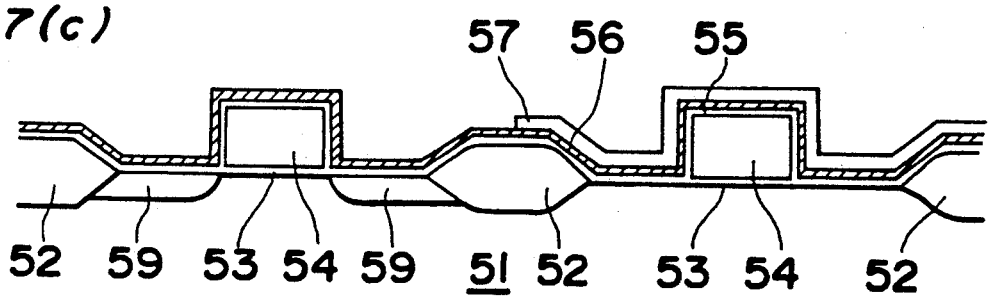

Thereafter, as shown in FIG. 7(c), a portion of the upper silicon dioxide film 57 disposed in the NMOS region is subjected to wet etching of solution of hydrogen fluoride (HF), while the remaining portion of the upper silicon dioxide film 57 disposed in the PMOS region is protected by the photoresist R1. At this time, the polysilicon film 56 acts as an etching stopper so as to protect the lower silicon dioxide film 55 and the constituent portions disposed below the silicon dioxide film 55. After the photoresist R1 has been removed, this wafer can be annealed at a relatively high temperature in order to repair damages caused by the ion implantation. If necessary, this annealing may be performed after a p+type region 60 to be described later has been formed.

Figure 7D:
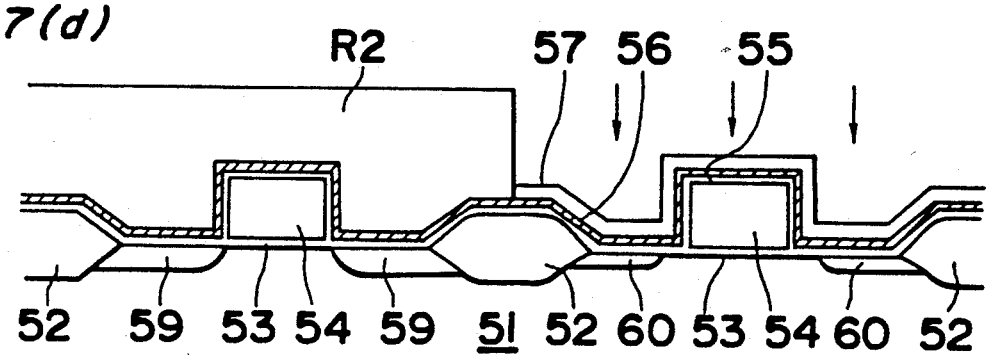

Then, as shown in FIG. 7(d), photolithography is performed so as to cover the NMOS region with a photoresist R2. When p type impurities are implanted in this state, p+ type regions 60 acting as source and drain regions, respectively are formed at locations which are disposed on opposite sides of the gate electrode 54 in the PMOS region and are spaced a distance approximately equal to the thickness of the stack of the films 55 to 57 from the gate electrode 54. After the photoresist R2 has been removed, annealing is performed for the p+type regions 60. Since n−type regions which constitute the LDD structure have not been formed yet, no problem arises even if annealing for the p+type regions 60 is performed at a relatively high temperature.

Figure 7E:
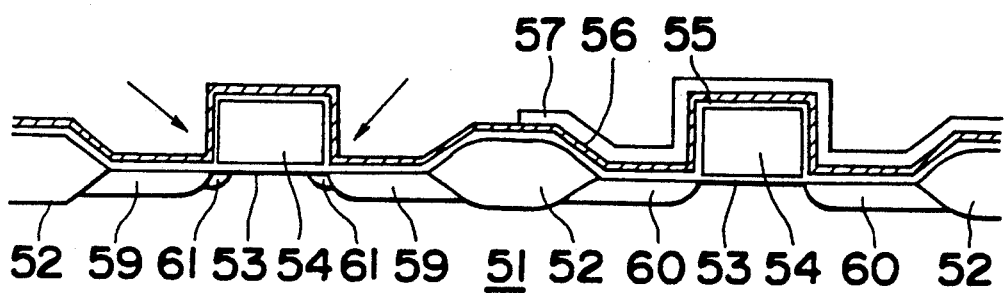

Subsequently, as shown in FIG. 7(e), when n type impurities are implanted obliquely by rotating waters, namely at a large angle of incidence relative to the surface of the substrate 51, n−type regions 61 are formed at opposed ends of the n+type regions 59 adjacent to the gate electrode 54 so as to be disposed immediately below the gate electrode 54 such that the GOLD structure is formulated. At this time, the upper silicon dioxide film 57 remaining in the PMOS region is used as a mask for ion implantation. Therefore, in contrast with prior art methods, photolithography can be eliminated. Meanwhile, it can also be so arranged that n type impurities are implanted substantially perpendicularly to, namely at a small angle of incidence relative to the surface of the substrate 51 such that a mere LDD structure is obtained.

Figure 7F:
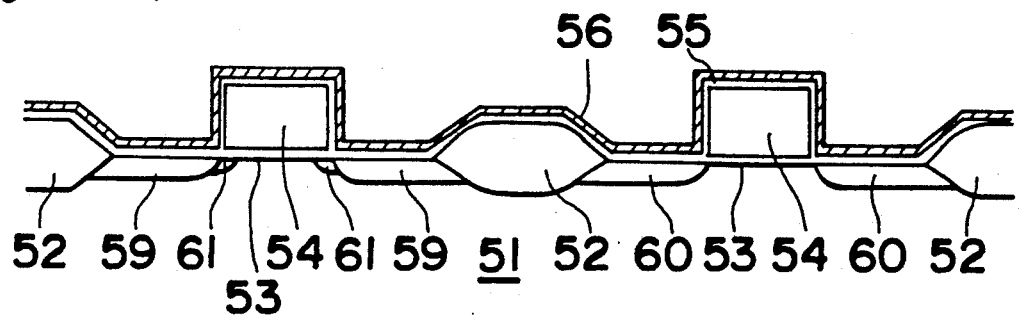
Figure 7G:
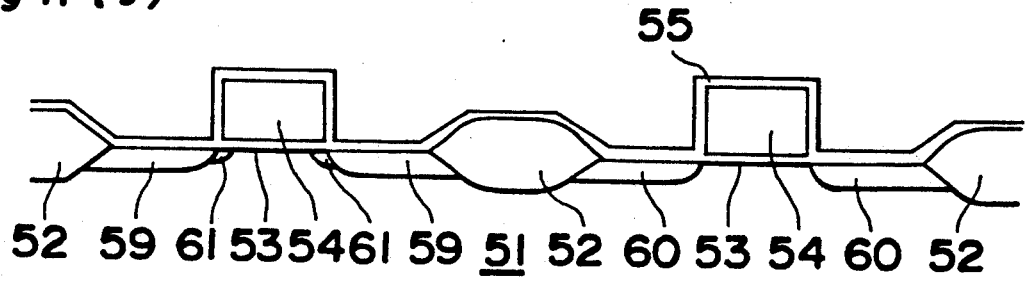

Thereafter, when the upper silicon dioxide film 57 in the PMOS region has been removed as shown in FIG. 7(f), heat treatment is performed so as to not only repair damages to the n−type region 61 due to ion implantation but activate dopant. At this time, since the heat treatment processes for the n+type regions 59 and the p+type regions 60 have been completed, this heat treatment can be performed at a relatively low temperature. Therefore, excessive diffusion of impurities in the n−type regions 61 can be prevented. Meanwhile, before or after this heat treatment, the polysilicon film 56 is removed as shown in FIG. 7(g).

FIGS. 8(a) to 8(h) show steps of a method of fabricating a CMOS device, according to a fourth embodiment of the present invention. The CMOS device comprises an NMOS region having a GOLD structure and a PMOS region having an LDD structure. Since steps of FIGS. 8(a) to 8(d) are the same as those of FIGS. 7(a) to 7(d), description thereof is abbreviated for the sake of brevity. The heat treatment processes for the n+type regions 59 acting as the source and drain regions, respectively and the p+type regions 60 acting as the source and drain regions, respectively may be performed concurrently or separately.

Figure 8A:
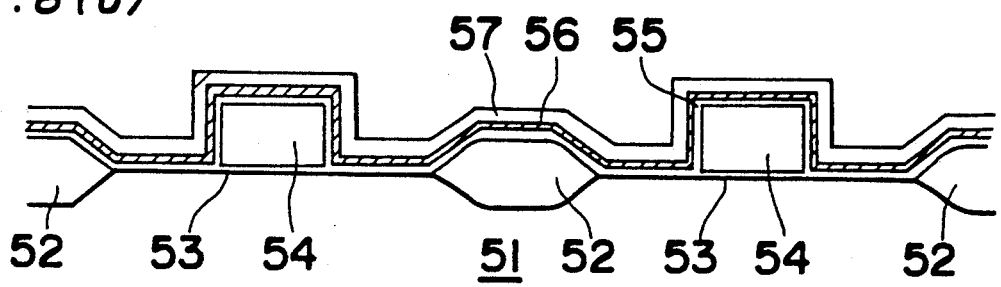
FIGS. 8(a) to 8(h) are views showing steps of a method of fabricating a CMOS device, according to a fourth embodiment of the present invention.
Figure 8B:
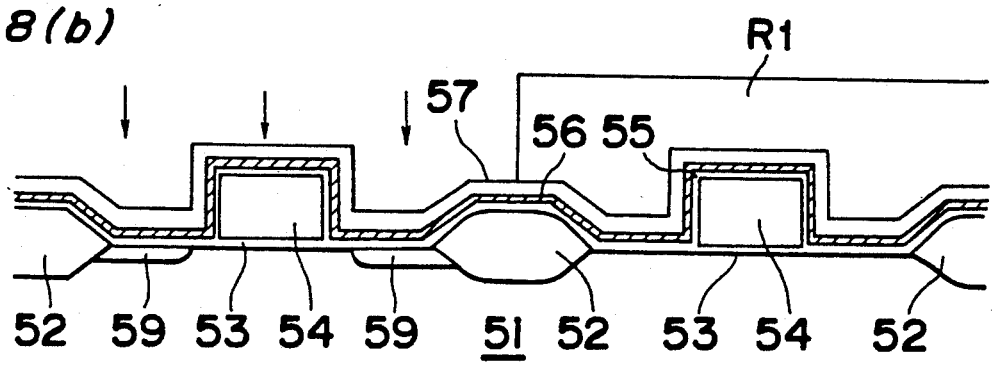
Figure 8C:
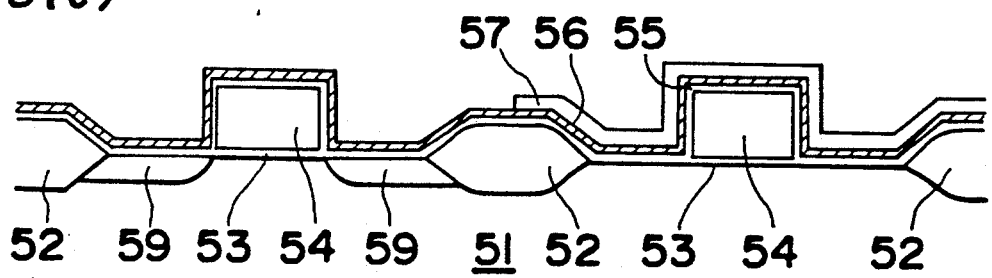
Figure 8D:
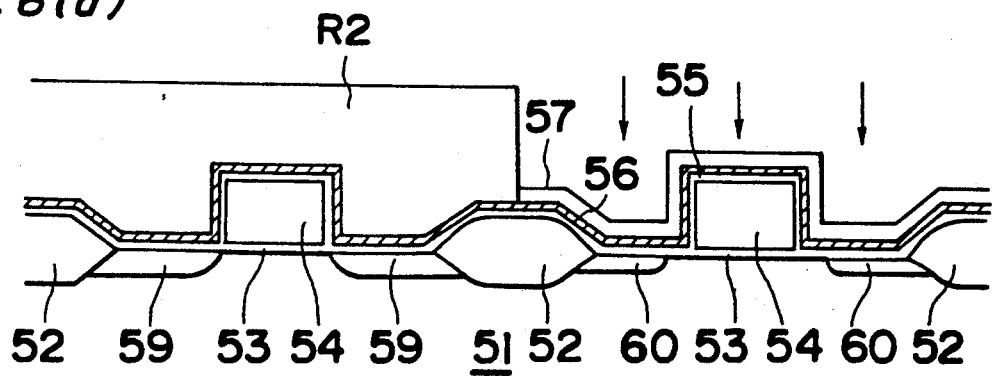
Figure 8E:
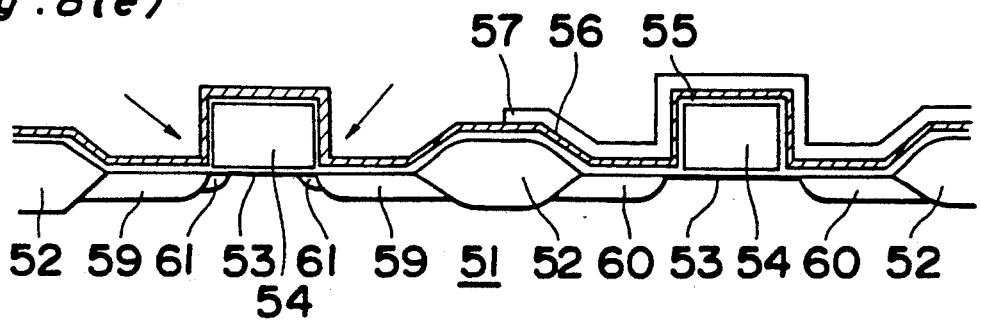

Subsequently, when n type impurities are implanted obliquely relative to the surface of the substrate 51 as shown in FIG. 8(e), the n⁻type regions 61 are formed at opposed ends of the n+type regions 59 adjacent to the gate electrode 54 so as to be disposed immediately below the gate electrode 54 such that the GOLD structure is formulated. At this time, the upper silicon dioxide film 57 remaining in the PMOS region is used as a mask for ion implantation in the same manner as in the third embodiment of the present invention. Accordingly, in contrast with the prior art methods, photolithography can be eliminated. Meanwhile, it can also be so arranged that n type impurities are implanted substantially perpendicularly to the surface of the substrate 51 such that a mere LDD structure is obtained.

Figure 8F:
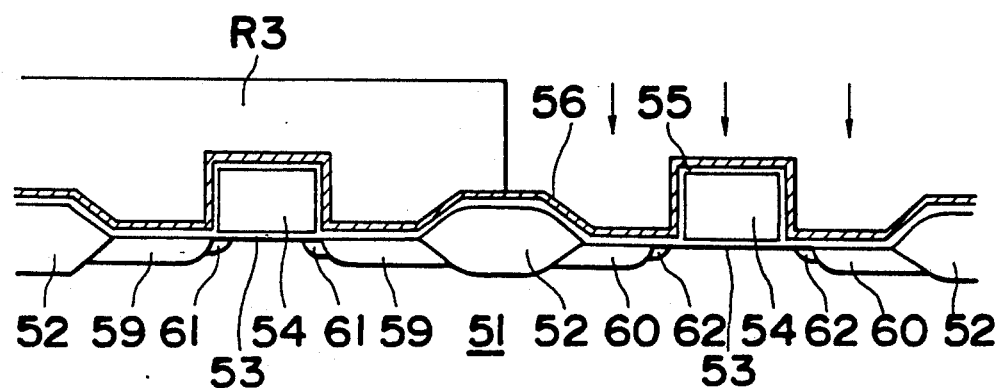

Then, as shown in FIG. 8(f), the upper silicon dioxide film 57 remaining in the PMOS region is removed and the NMOS region is covered by photoresist R3. When p type impurities are implanted substantially perpendicularly to the surface of the substrate 51 in this state, p⁻type regions 62 are formed at opposed ends of the p+type regions 60 such that the LDD structure is obtained.

Figure 8G:
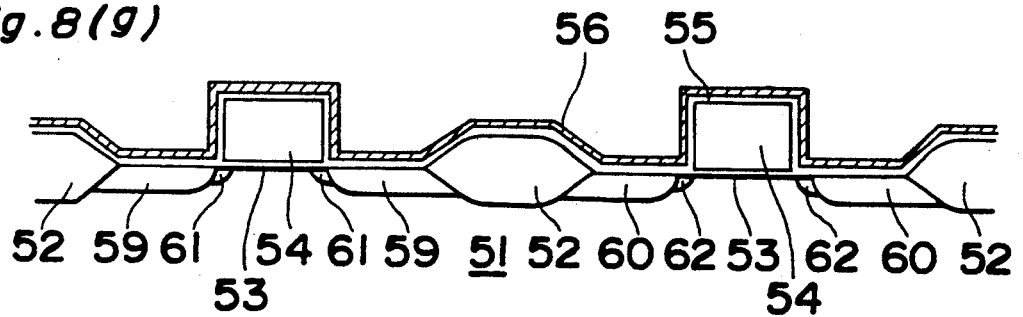
Figure 8H:
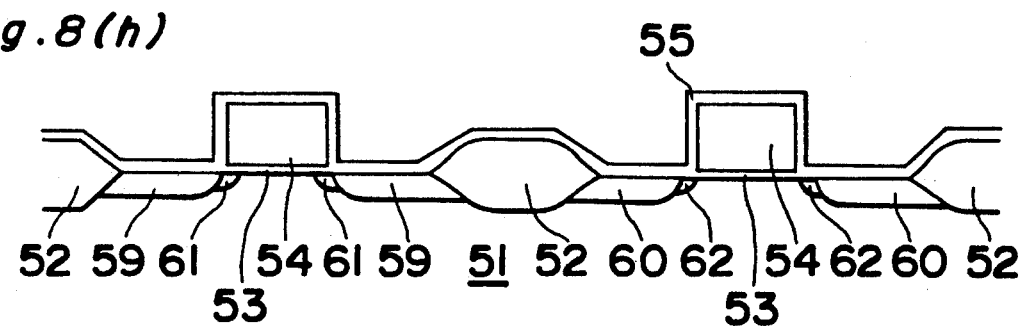

Thereafter, as shown in FIG. 8(g), the photoresist R3 is removed and then, heat treatment is performed so as to repair damages to the n⁻type regions 61 and the p⁻type regions 62 due to ion implantation. Since the heat treatment processes for the n+type regions 59 and the p+type regions 60 have been completed at this time in the same manner as in the third embodiment, this heat treatment can be performed at a relatively low temperature. Consequently, excessive diffusion of impurities in the n- type regions 61 and the p⁻type regions 62 can be prevented. Finally, as shown in FIG. 8(h), the polysilicon film 6 is removed.

Figure 9A:
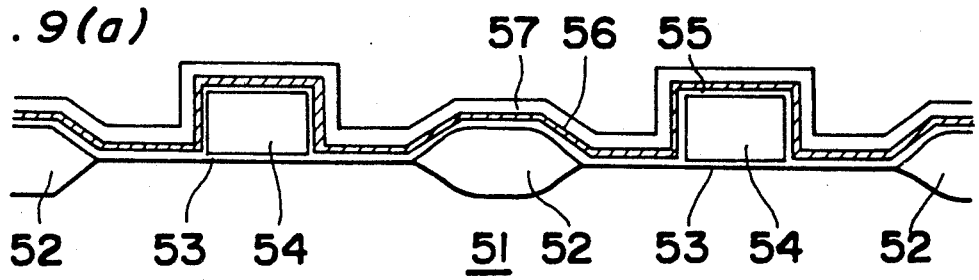
FIGS. 9(a) to 9(h) are views showing steps of a method of fabricating a CMOS device, according to a fifth embodiment of the present invention.
Figure 9B:
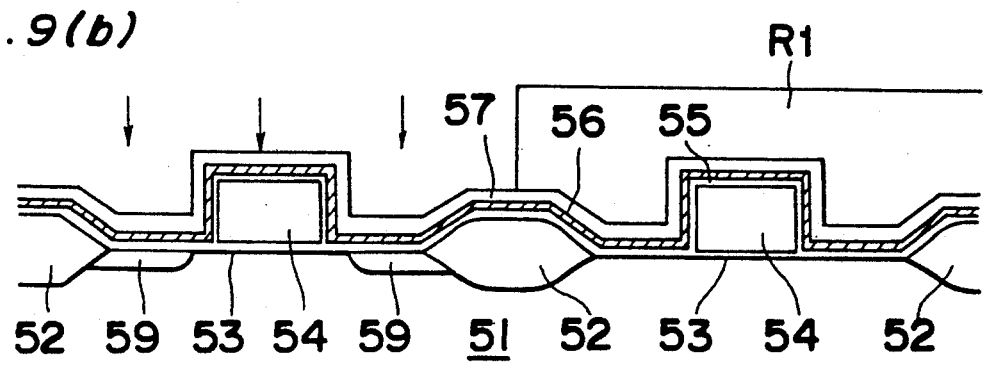
Figure 9C:
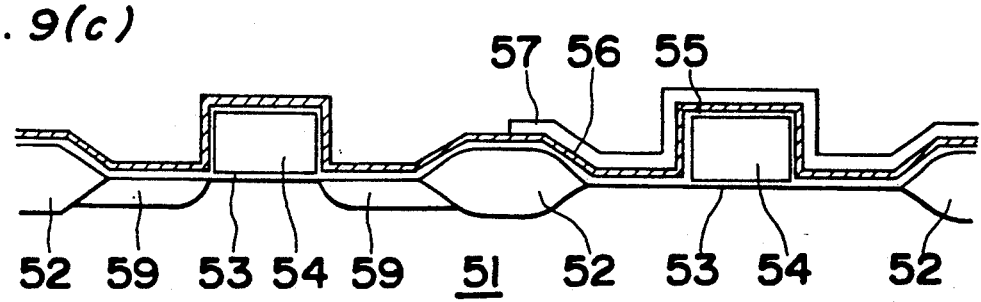
Figure 9D:
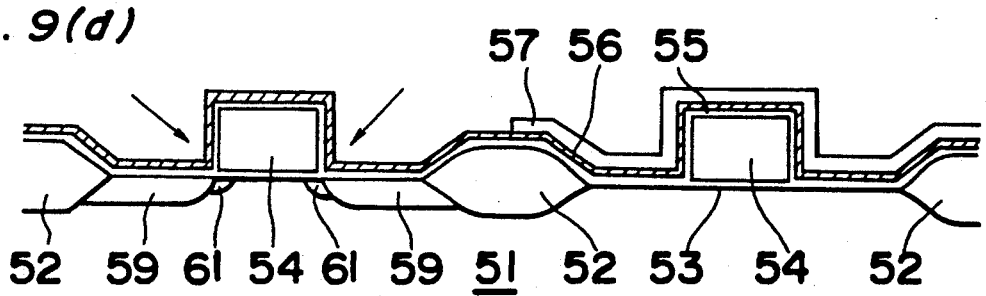

FIGS. 9(a) to 9(h) show steps of a method of fabricating a CMOS device, according to a fifth embodiment of the present invention. The CMOS device comprises an NMOS region having a GOLD structure and a PMOS region having an LDD structure. Since steps of FIGS. 9(a) to 9(c) are the same as those of FIGS. 7(a) to 7(c), description thereof is abbreviated for the sake of brevity. Then, as shown in FIG. 9(d), when n type impurities are implanted obliquely relative to the surface of the substrate 51, the n⁻type regions 61 are formed at opposed ends of the n type regions 59 adjacent to the gate electrode 54 so as to be disposed immediately below the gate electrode 54 such that the GOLD structure is obtained.

Figure 9E:
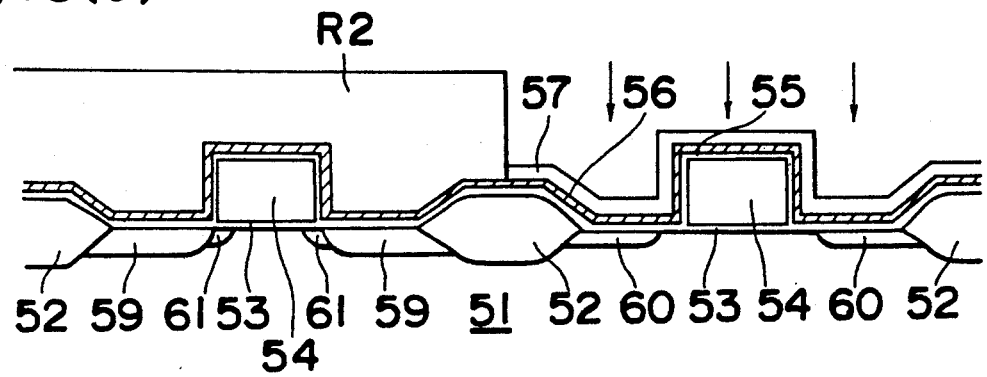

Subsequently, as shown in FIG. 9(e), the NMOS region is covered by the photoresist R2. When p type impurities are implanted substantially perpendicularly to the surface of the substrate 51, the p+type regions 60 are formed at locations which are disposed on opposite sides of the gate electrode 54 in the PMOS region and are spaced a distance approximately equal to the thickness of the stack of the films 55 to 57 from the gate electrode 54.

Figure 9F:
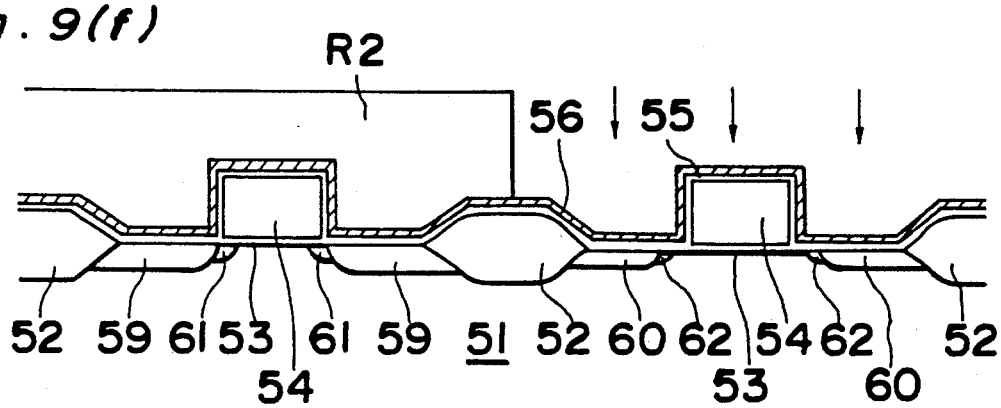

Thereafter, as shown in FIG. 9(f), the upper silicon dioxide film 57 remaining in the PMOS region is removed. When p type impurities are implanted substantially perpendicularly to the surface of the substrate 51 in this state, the p⁻type regions 62 are formed at opposed ends of the p+type regions 60 adjacent to the gate electrode 54.

Figure 9G:
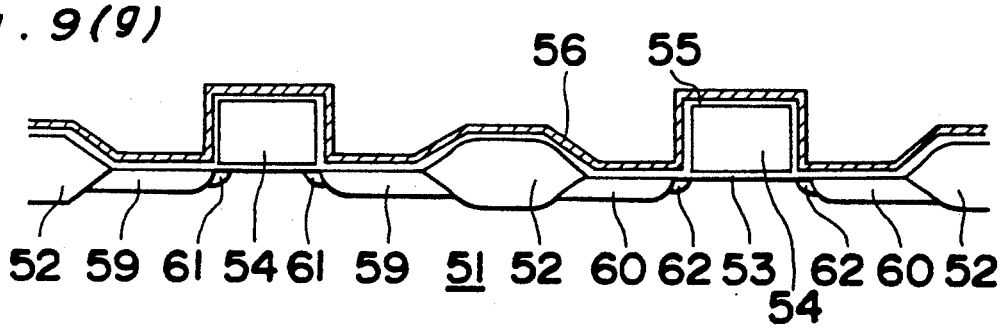

Furthermore, as shown in FIG. 9(g), the photoresist R2 is removed and then, heat treatment is performed at low temperatures so as to repair damages to the n⁻type regions 61 and the p+type regions 62 due to ion implantation. In the same manner as in the third and fourth embodiments, excessive diffusion of impurities in the n⁻type regions 61 and the p+type regions 62 can be prevented and thus, short channel characteristics of transistors can be improved.

Figure 9H:
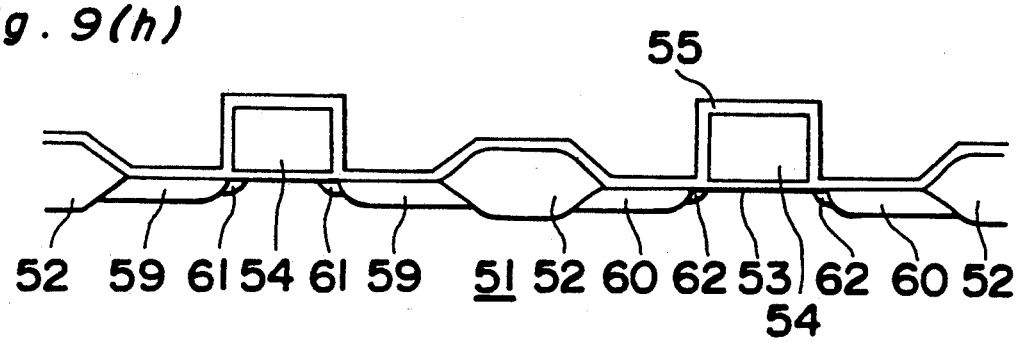

Finally, as shown in FIG. 9(h), the polysilicon film 56 is removed.

FIGS. 10(a) to 10(g) show steps of a method of fabricating a CMOS device, according to a sixth embodiment of the present invention. The CMOS device comprises an NMOS region having a DI(double implanted)-GOLD or halo-implanted GOLD structure and a PMOS region having an LDD structure. Since steps of FIGS. 10(a) to 10(e) are the same as those of FIGS. 8(a) to 8(e) of the fourth embodiment, description thereof is abbreviated for the sake of brevity.

Figure 10A:
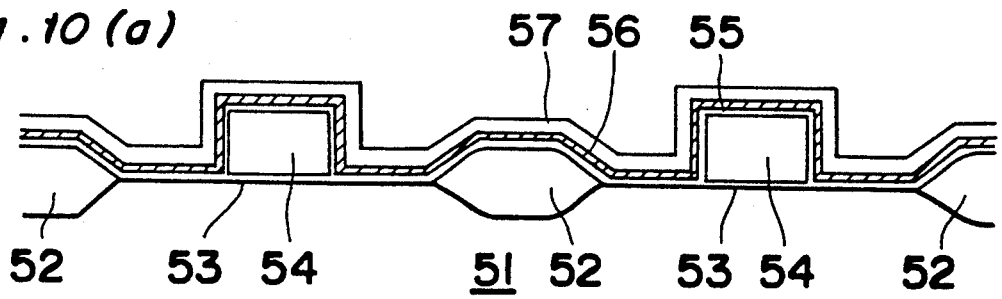
FIGS. 10(a) to 10(g) are views showing steps of a method of fabricating a CMOS device, according to a sixth embodiment of the present invention.
Figure 10B:
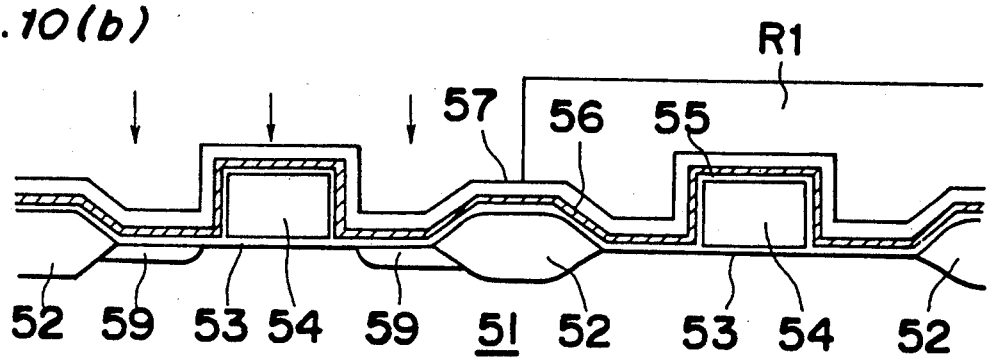
Figure 10C:
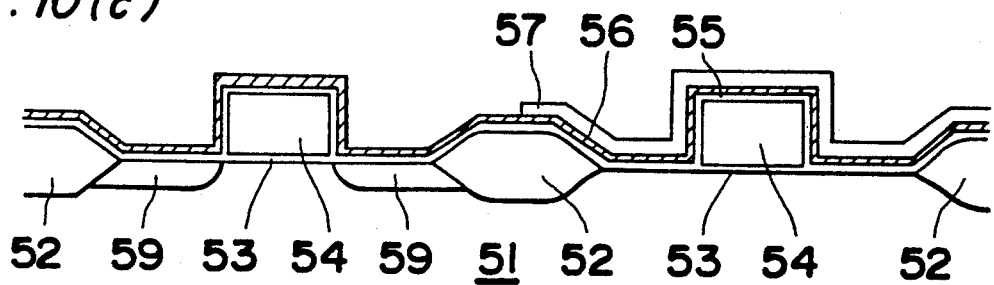
Figure 10D:
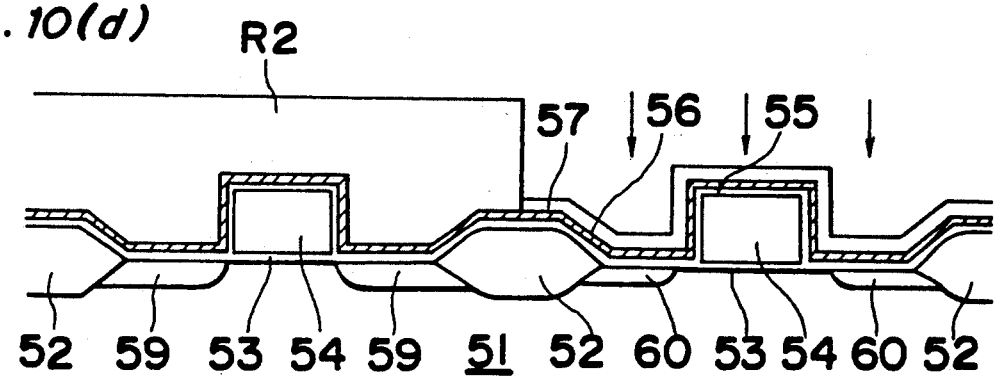
Figure 10E:
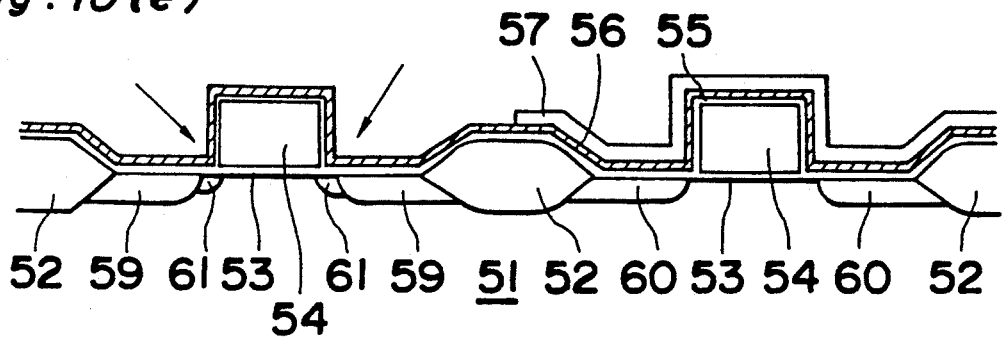
Figure 10F:
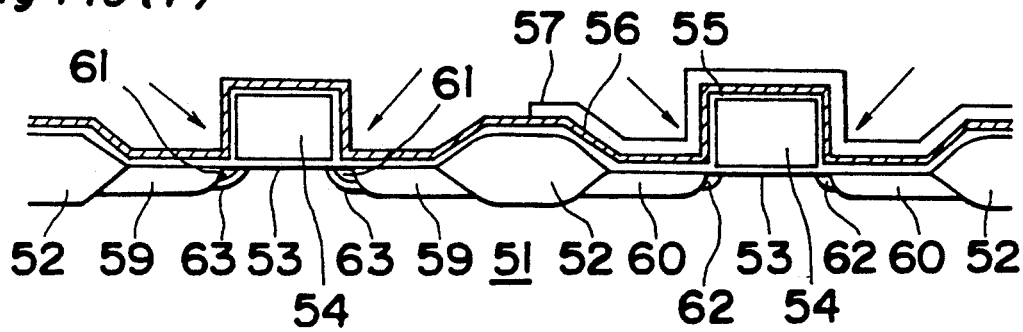

Then, as shown in FIG. 10(f), p type impurities are implanted obliquely relative to the surface of the substrate 51. At this time, since thickness of side walls of the gate electrode 54 in the NMOS region is different from that of the PMOS region, namely thickness of side walls of the gate electrode 54 in the PMOS region is larger than that of the NMOS region by thickness of the upper silicon dioxide film 57, not only the p⁻type regions 62 can be formed at opposed ends of the p+type regions 60 adjacent to the gate electrode 54 in the PMOS region but p⁻type halo regions 63 enclosing the n⁻type regions 61 can be formed in the NMOS region. The p⁻type halo regions 63 suppress expansion of the depletion region, thereby resulting in further improvement of short channel characteristics of transistors. As a result, the CMOS device can be miniaturized.

Figure 10G:
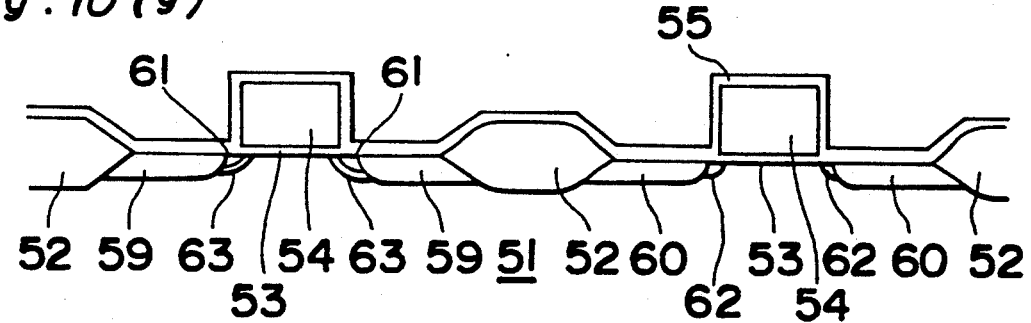

Finally, as shown in FIG. 10(g), the upper silicon dioxide film 57 remaining in the PMOS region and the polysilicon film 56 remaining on the entire surface of the NMOS region and the PMOS region are removed.

Meanwhile, in the above third to sixth embodiments, the polysilicon film 56 is used as the etching stopper film but may be replaced by another film such as a silicon nitride film. In this case, since the silicon nitride film is electrically insulative, the silicon nitride film may be left on the lower silicon dioxide film 55 without being removed at the final step. In the case where the etching stopper is formed of silicon nitride, the films 55 and 56 may be replaced by a single layer made of SiN.

As will be seen from the foregoing, when the fabrication methods according to the third to sixth embodiments of the present invention are applied to the NMOS region and the PMOS region in combination with photolithography, the CMOS device having the LDD structure can be fabricated easily.

Furthermore, in accordance with the third to sixth embodiments of the present invention, since heat treatment for the n⁻type regions and the p⁻regions can be performed after heat treatment processes for the n+type regions and the p+type regions have been completed, excessive diffusion of impurities in the n⁻type regions and the p⁻type regions can be prevented, thereby resulting in improvement of short channel characteristics of transistors.

Meanwhile, in the case where the halo regions having a conductive type opposite to that of the n⁻type regions or the p⁻type regions and enclosing the n⁻type regions or the p⁻type regions are formed by implanting ions obliquely relative to the surface of the substrate, expansion of the depletion region will be suppressed when a bias is applied to the drain terminal. As a result, short channel characteristics of transistors can be further improved and thus, the CMOS device can also be miniaturized.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of fabricating an insulating gate type field-effect transistor in which a region having a low carrier density for mitigating electric field is provided so as to abut on a source/drain region having a high carrier density, the method comprising the steps of:
    forming a gate insulating film and a gate electrode on a semiconductor substrate;
    depositing an insulating thin film on the gate electrode and the gate insulating film to a vertical thickness; and
    performing from above the insulating thin film, ion implantation at an implantation energy inducing a projected range of ions approximately equal to the vertical thickness of the insulating thin film so as to form the source/drain region;
    wherein a horizontal thickness of the insulating thin film on opposite sides of the gate electrode is larger than a sum of a lateral diffusion distance of the source/drain region at the time of the ion implantation and a lateral diffusion distance of the source/drain region after the ion implantation.

2. A method as claimed in claim 1, wherein the vertical thickness of the insulating thin film is equal to the horizontal thickness of the insulating thin film.

3. A method of fabricating an insulating gate type field-effect transistor in which a region having a low carrier density for mitigating electric field is provided so as to abut on a source/drain region having a high carrier density, the method comprising the steps of:
    forming a gate insulating film and a gate electrode on a silicon substrate sequentially;
    performing, by using the gate electrode as a mask, ion implantation not only at an acceleration energy inducing a larger projected range of ions than a thickness of the gate insulating film but at a dose sufficiently smaller than a predetermined dose for forming the source/drain region so as to form the region in the silicon substrate;
    depositing an insulating thin film on the gate electrode and the gate insulating film to a vertical thickness;
    performing further ion implantation at an implantation energy inducing a projected range of ions approximately equal to the vertical thickness of the insulating thin film so as to form the source/drain region; and
    performing heat treatment;
    wherein a horizontal thickness of the insulating thin film on opposite sides of the gate electrode is larger than a sum of a lateral diffusion distance of the source/drain region at the time of the further ion implantation and a lateral diffusion distance of the source/drain region after the heat treatment.

4. A method of fabricating a semiconductor device, comprising the steps of:
    forming on a substrate having a gate electrode, a stack of a lower silicon dioxide film, an etching stopper film made of a material capable of being etched selectively for a silicon dioxide film and an upper silicon dioxide film so as to set the stack of the lower silicon dioxide film, the etching stopper film and the upper silicon dioxide film to a predetermined thickness such that an upper face and opposite side faces of the gate electrode and a portion of a surface of the substrate disposed on opposite sides of the gate electrode are covered by the stack;
    performing ion implantation substantially perpendicularly to the surface of the substrate through the stack such that a pair of n+type regions or a pair of p+type regions acting as source and drain regions are, respectively, formed at locations which are disposed on opposite sides of the gate electrode and are spaced a distance approximately equal to the thickness of the stack from the gate electrode;
    etching the upper silicon dioxide film up to the etching stopper film; and
    performing further ion implantation substantially perpendicularly to or obliquely relative to the surface of the substrate so as to form an n−type region or a p−type region at an end portion of the n+type regions or the p+type regions adjacent to the gate electrode.

5. A method as claimed in claim 4, further comprising the step of performing ion implantation obliquely relative to the surface of the substrate so as to form a halo region having a conductive type opposite to that of the n−type region or the p−type region such that the halo region encloses the n−type region or the p−type region.

* * * * *